United States Patent
Elzeftawi

(10) Patent No.: US 9,385,769 B2
(45) Date of Patent: Jul. 5, 2016

(54) PHASE-LOCKED LOOP WITH AN ADJUSTABLE OUTPUT DIVIDER

(71) Applicant: Xilinx, Inc., San Jose, CA (US)

(72) Inventor: Mohamed N. Elzeftawi, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/562,531

(22) Filed: Dec. 5, 2014

(65) Prior Publication Data

US 2016/0164558 A1  Jun. 9, 2016

(51) Int. Cl.
  *H04B 1/00* (2006.01)
  *H04B 1/16* (2006.01)
  *H03D 7/14* (2006.01)
  *H04B 1/04* (2006.01)
  *H03L 7/183* (2006.01)

(52) U.S. Cl.
  CPC ............. *H04B 1/163* (2013.01); *H03D 7/1441* (2013.01); *H04B 1/0483* (2013.01); *H03L 7/183* (2013.01)

(58) Field of Classification Search
  USPC ............ 455/84, 76, 260; 331/57, 34, 16, 185, 331/100; 327/156, 148, 115, 159
  See application file for complete search history.

(56) References Cited

U.S. PATENT DOCUMENTS

| | | | | |
|---|---|---|---|---|
| 6,061,418 A | * | 5/2000 | Hassoun | H03K 21/10 327/115 |
| 6,542,040 B1 | * | 4/2003 | Lesea | H03L 7/087 327/156 |
| 8,378,723 B1 | * | 2/2013 | Atesoglu | H03L 7/099 327/148 |
| 2007/0001770 A1 | * | 1/2007 | Wang | H03L 7/1972 331/16 |
| 2007/0026816 A1 | * | 2/2007 | Heidari | H03D 7/1441 455/76 |
| 2007/0293163 A1 | * | 12/2007 | Kilpatrick | H04B 1/0483 455/84 |
| 2012/0331432 A1 | * | 12/2012 | Ficke | H03L 7/083 716/103 |

* cited by examiner

*Primary Examiner* — Ganiyu A Hanidu
(74) *Attorney, Agent, or Firm* — W. Eric Webstad

(57) ABSTRACT

An apparatus relates generally to providing a divided signal output. In such an apparatus, a controller is coupled to receive a reference frequency count and a feedback frequency count to determine a difference therebetween to provide a control setting. A divider is coupled to receive the control setting to provide the divided signal output. The divider includes an adjustable load impedance. The control setting is coupled to adjust the load impedance of the divider to adjust a self-resonance frequency of the divider.

20 Claims, 9 Drawing Sheets

PHASE-LOCKED LOOP WITH AN ADJUSTABLE OUTPUT DIVIDER

FIELD OF THE INVENTION

The following description relates to integrated circuit devices ("ICs"). More particularly, the following description relates to a phase-locked loop with an adjustable output divider for an IC.

BACKGROUND

Integrated circuits may use phase-locked loops ("PLLs") to generate oscillating signals, such as signals with a clock pattern ("clock signals" or "clocks"). For high-frequency analog PLLs, generating I and Q signals in output IQ dividers in such analog PLLs may be problematic due to disparate sensitivity curves of such IQ dividers.

Accordingly, it would be desirable and useful to provide an analog PLL that overcomes one or more of the limitations associated with disparate sensitivity curves of IQ dividers.

SUMMARY

An apparatus relates generally to providing a divided signal output. In such an apparatus, a controller is coupled to receive a reference frequency count and a feedback frequency count to determine a difference therebetween to provide a control setting. A divider is coupled to receive the control setting to provide the divided signal output. The divider includes an adjustable load impedance. The control setting is coupled to adjust the load impedance of the divider to adjust a self-resonance frequency of the divider.

A method relates generally to tuning an adjustable divider. In such a method, a calibration mode is initiated to cause the adjustable divider to self-resonate to obtain a feedback count. A difference is determined between a reference count and the feedback count to produce an error vector. A control setting is obtained using the error vector. The adjustable divider is adjusted with the control setting.

A method relates generally to adjusting an operating range of a phase-locked loop in an integrated circuit die. In such a method, an output of a voltage controlled oscillator of the phase-locked loop is disabled. Codes of an adjustable IQ divider of the phase-locked loop are swept. Self-resonance frequencies are obtained as outputs of the adjustable IQ divider corresponding to the codes swept. A table is populated with the codes swept having pointers respectively thereto. The pointers are respectively associated with the self-resonance frequencies. A code of the codes is selected for a predetermined operating frequency to adjust another adjustable IQ divider in another phase-locked loop in the integrated circuit die.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

For high-frequency analog PLL applications, a polyphase filter at the output of such an analog PLL conventionally tends to be too lossy. Accordingly, IQ division is conventionally used for such analog PLL application. Unfortunately, semiconductor process corners may cause some IQ dividers to have too narrow, if any, frequency range for input amplitude.

As described below in additional detail, a self-resonance frequency of an IQ divider may be determined prior to tuning, namely a self-resonance frequency of an IQ divider in its natural state. If such self-resonance frequency is too far away from a predetermined frequency output of such an IQ divider of an analog PLL, then such IQ divider is adjusted or tuned to shift such self-resonance frequency at least closer, if not to, such predetermined frequency output. This may enlarge an operating frequency range of such an analog PLL for an input amplitude, and this IQ divider may work with lower input amplitudes. Thus, a stage preceding such an IQ divider may be operated with less power. Accordingly, a wide frequency operating range may be provided for high-frequency analog PLLs.

As described below in additional detail, operating an analog PLL with a VCO thereof disabled, an IQ divider with a zero, namely no appreciable, voltage input may self-resonate. An analog PLL with a self-resonating IQ divider may have its load impedance adjusted until such self-resonance frequency locks to a reference frequency, namely "an impedance-locked loop" condition.

With the above general understanding borne in mind, various configurations for PLLs and IQ dividers thereof are generally described below.

Figure 1:
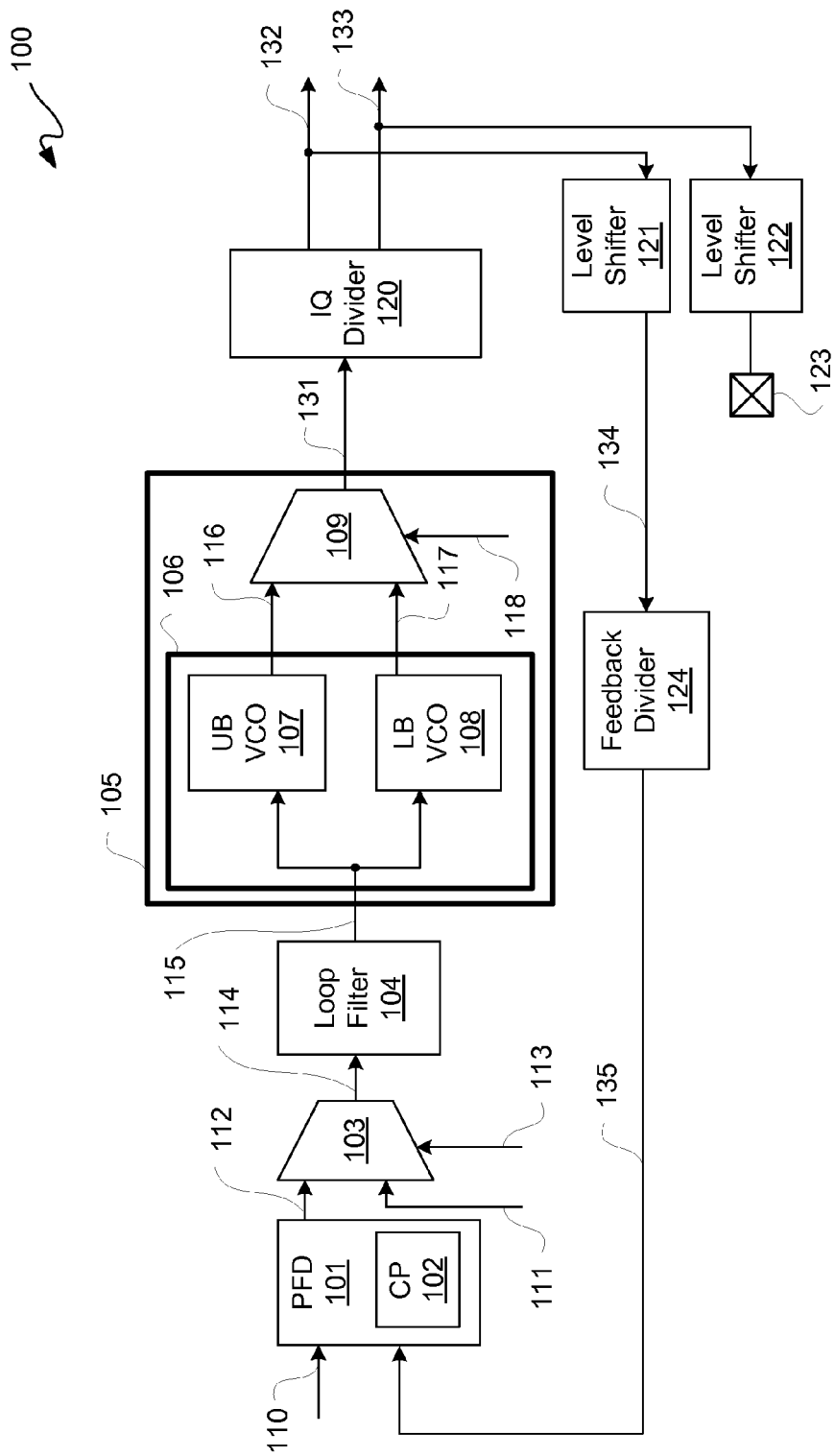
FIG. 1 is a block diagram depicting an exemplary quadrature phase-locked loop ("QPLL").

FIG. 1 is a block diagram depicting an exemplary quadrature phase-locked loop ("QPLL") 100 previously known by the inventor(s) hereof. QPLL 100 includes a phase-frequency detector ("PFD") 101, an optional multiplexer ("mux") 103, a loop filter 104, a voltage controlled oscillator ("VCO") circuit 105, an IQ divider 120, a first level shifter 121, a second level shifter 122, and a feedback divider 124. PFD 101 may include a charge pump ("CP") 102. VCO circuit 105 may include a VCO 106 and a mux 109. VCO 106 may include an upper-band ("UB") VCO 107 and a lower-band ("LB") VCO 108. For purposes of clarity by way of example and not limitation, it shall be assumed that a QPLL configuration as in QPLL 100 is used. Signals 110 through 118 and signals 131 through 135 of QPLL 100 are further described with reference to FIG. 2. However, configuration of QPLL 100 is not described in unnecessary detail for purposes of clarity.

Figure 2:
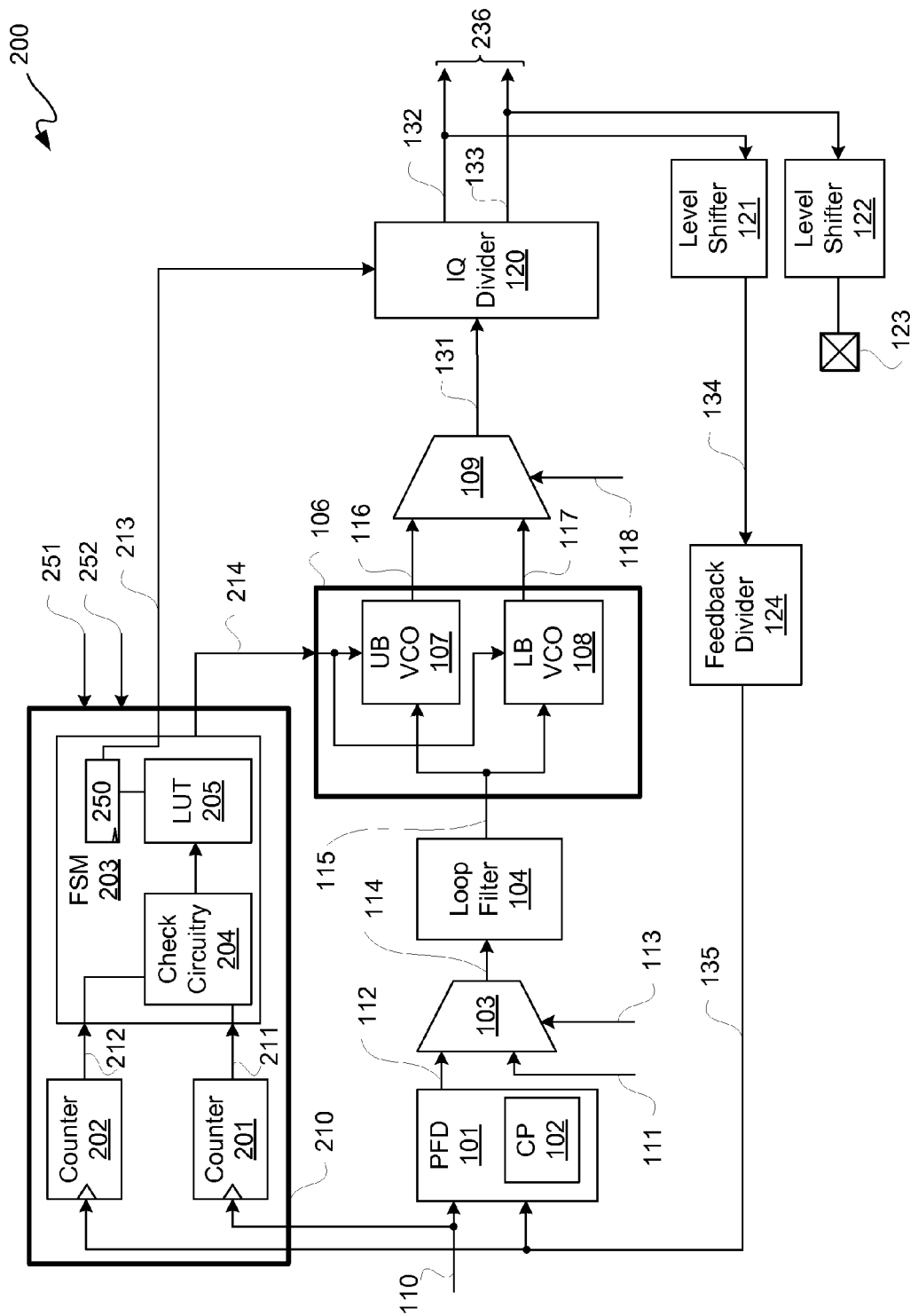
FIG. 2 is a block diagram depicting an exemplary adjustable phase-locked loop ("PLL").

FIG. 2 is a block diagram depicting an exemplary adjustable phase-locked loop ("PLL") 200. An integrated circuit die, such as FPGA 1000 of FIG. 10 or another integrated circuit die, may include multiple adjustable PLLs 200. Each or some of these adjustable PLLs 200 may include an adjustable impedance IQ divider 120. For adjustment of impedance, a load resistance and/or a load capacitance of an IQ divider 120 may be adjusted.

In this example, adjustable PLL 200 is an adjustable QPLL; however, in other implementations more divisions may be used to provide more signal outputs for covering more phases than in this example. Adjustable QPLL 200 includes QPLL 100 of FIG. 1. Adjustable QPLL 200 further includes a controller 210.

A QPLL with a controller for adjusting capacitance of VCO 106 was suggested by others at Xilinx, Inc. of San Jose, Calif., the assignee hereof. However, controller 210 is configured to provide for adjustment of IQ divider 120 separately or additionally with respect to adjusting capacitance of VCO 106. For purposes of clarity by way of example and not limitation, it shall be assumed that controller 210 is coupled and configured for adjustment of both IQ divider 120 and VCO 106, even though in other implementations controller 210 may not be coupled and configured for adjusting capacitance of VCO 106.

Along those lines, an IQ divider 120 may be used for example instead of a polyphase filter. Polyphase filters with multiple stages, namely wider frequency range of operation, tend to be lossy (e.g., approximately 10 to 12 dB) at high frequencies, namely frequencies generally above approximately 10 GHz. Along those lines, QPLL 200 may be for high-frequency applications, namely for a reference clock signal 110 at approximately 10 GHz or higher.

Adjustable QPLL 200 provides a divided signal output, such as quadrature clock signals 132 and 133. Even though two quadrature clock signals 132 and 133, these two quadrature clock signals 132 and 133 represent four signals that are in quadrature, as mux 109 may select between UB oscillating signal 116 and LB oscillating signal 117.

Controller 210 may include a first counter 201, a second counter 202, and a finite state machine ("FSM") 203. First counter 201 may be coupled to receive a reference clock signal 110 to provide a reference frequency count signal ("reference frequency count") 211 for signal 110. Second counter 202 may be coupled to receive a feedback clock signal 135 to provide a feedback frequency count signal ("feedback frequency count") 212 for signal 135. Counters 201 and 202 may or may not be part of controller 210; however, controller 210 is coupled to receive a reference frequency count 211 and a feedback frequency count 212 to determine a difference therebetween to provide a control setting, as described below in additional detail.

IQ divider 120, which in this example is a divide by two IQ divider, may be coupled to receive a control setting signal ("control setting") 213 for calibration of IQ divider 120 in a divider calibration mode of controller 210. IQ divider 120 may be adjusted to provide a divided signal output 236, such as quadrature clock signals 132 and 133 in this example. Check circuitry 204, LUT 205, and register 250 of controller 210, as well as input signals 251 and 252 to controller 210, are described below in additional detail.

Figure 3:
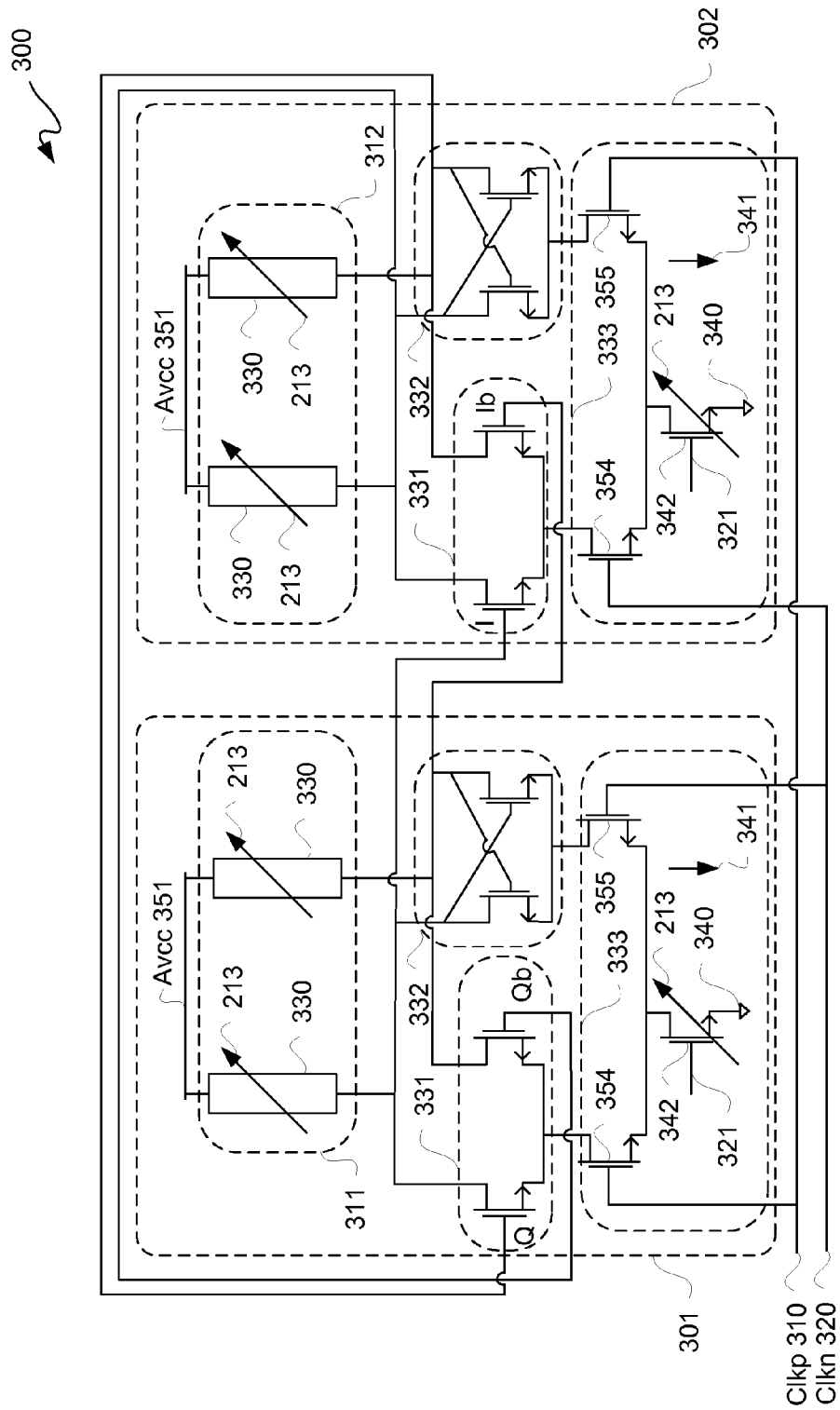
FIG. 3 is a schematic/block diagram depicting an exemplary conventional adjustable IQ divider.

FIG. 3 is a schematic/block diagram depicting an exemplary conventional adjustable IQ divider 300. In this example, IQ divider 300 is a divide-by-two divider. Adjustable IQ divider 300 may be used for IQ divider 120 of FIGS. 1 and 2.

IQ divider 300 includes a Q circuit 301 coupled to an I circuit 302. Q circuit 301 and I circuit 302 are coupled to receive a positive side clock signal ("Clkp") 310 and a negative side clock signal ("Clkn") 320. These clock signals 310 and 320 in FIG. 2 may be a UB oscillating signal 116 and an LB oscillating signal 117 selectively output from mux 109 responsive to control select signal 118 as oscillator output 131. As clocks 310 and 320 are out-of-phase with respect to one another, such as generally 180 degrees out-of-phase, IQ divider 300 may be injection locked to a frequency of such clocks, as generally both of clocks 310 and 320 are at the same frequency.

Q circuit 301 and I circuit 302 respectively include adjustable circuits 311 and 312. Each of adjustable circuits 311 and 312 may be coupled between a supply voltage for an analog device, such as Avcc bus 351, and corresponding common mode logic ("CML") 331 and latch circuitry 332 of Q circuit 301 and I circuit 302. Outputs of Q circuit 301 are provided as inputs to I circuit 302, and vice versa.

This cross-coupling of inputs and outputs of IQ divider 300 means that IQ divider 300 may have a self-resonance frequency. In other words, an IQ divider 300 may oscillate on its own, namely without any input on either of clock signals 310 or 320, or with DC input on both of clock signals 310 and 320, or some other disable condition of input of a clock pattern via clock signals 310 and 320. This self-resonance frequency may generally be determined by an RC (i.e., resistive-capacitive) delay per stage, such as Q circuit 301 stage and I circuit 302 stage.

Coupling of CML 331 and latch circuitry 332 of each of Q circuit 301 and I circuit 302 to and from ground node ("ground") 340 may be responsive to clocks 310 and 320 gating corresponding tail current circuits 333. Each of tail current circuits 333 may have a pair of same polarity transistors coupled in source-drain parallel, such as paris of NMOS transistors 354 and 355. Source nodes of such pairs of NMOS transistors 354 and 355 may be coupled to ground. Optionally, this coupling to ground 340 may be adjusted with an adjustable tail current bias voltage signal ("bias voltage signal") 321 provided to ground coupling transistor 342, for example with a drain node coupled to source nodes of transistors 354 and 355 and a source node coupled to ground 340 in of each tail current circuits 333. In this example, such a bias voltage signal 321 is an nbias voltage signal as NMOS transistors are illustratively depicted in this example. However, in another implementation PMOS, or a combination of NMOS and PMOS, transistors may be used. In another implementation, an IQ divider without a tail current source, such as transistors 342, may be used, as described below in additional detail. In such an implementation, AC-couple clock inputs 310 and 320 cross-coupling gate nodes of transistors 354 and 355 in mirrored tail current circuits 333 may be directly AC-coupled to transistors 354 and 355 in each of tail current circuits 333 with transistors 342 omitted in favor such clock gated AC-coupled transistors thereof. In such an implementation, source nodes of transistors 354 and 355 have their sources connected directly to ground 340. Resistors (not shown) may be coupled to gate nodes of such pairs of transistors after an AC-coupling capacitor (not shown) to set the DC-bias points of these transistors. This may provide more headroom for low-power voltage supplies by reducing transistor stacking by in effect removing transistors 342.

Bias voltage signal 321 may be used to control current flow of a tail current 341 of Q circuit 301 and I circuit 302 to ground. Along those lines, bias voltage signal 321 may be adjustable responsive to at least a portion of control setting 213. Thus, the amount of tail current 341 may be controlled by how conductive a channel of transistor 342 is. Such tail current 341 may be adjusted to effectively shift a sensitivity curve of IQ divider 300 so lower input amplitude of clocks 310 and 320 may be used.

Each of adjustable circuits 311 and 312 may include two adjustable blocks 330 coupled to Avcc bus 351 and coupled to receive control setting 213. Each of adjustable blocks 330 may include an adjustable load, such as an adjustable resistor, an adjustable capacitor and a fixed resistor coupled to one another, an adjustable resistor and an adjustable capacitor coupled to one another, an adjustable resistor and a fixed capacitor coupled to one another, or another adjustable load configuration. Generally, resistance ("R") and capacitance ("C") of adjustable blocks 330 may provide an RC adjustable time constant which affects a self-resonance frequency of IQ divider 300. By adjusting such RC adjustable time constant, a self-resonance frequency of IQ divider 300 may be shifted along the frequency axis. For example, smaller RC delay per stage translates to a faster self-resonance frequency provided there is sufficient gain to start oscillating.

For purposes of clarity by way of example and not limitation, it shall be assumed that each of blocks 330 is an adjustable resistor 330 coupled to receive control setting 213 to set an adjustable load impedance thereof. This may be useful as addition of capacitance to that already present in circuitry of IQ divider 300, including without limitation parasitic capacitance, may be problematic for high-frequency operation. Furthermore, for purposes of clarity by way of example and not limitation, ground coupling transistors 342 may be replaced with a direct connection to ground 340 in tail current circuits 333 for high-frequency operation.

Generally, each of blocks 330 may include at least one of an adjustable load impedance or an adjustable load capacitance. At least a portion of a control setting 213 may be used to adjust such at least one of load impedance or load capacitance of IQ divider 300 to adjust at least one of a self-resonance frequency of an IQ divider 300, as described below in additional detail. Optionally or additionally, adjustable tail current circuits 333 may be included in IQ divider 300. Generally, for example, control setting 213 may be a code provided as multiple bits via a control setting bus to set an adjustable load and/or an adjustable tail current of IQ divider 300.

Figure 4:
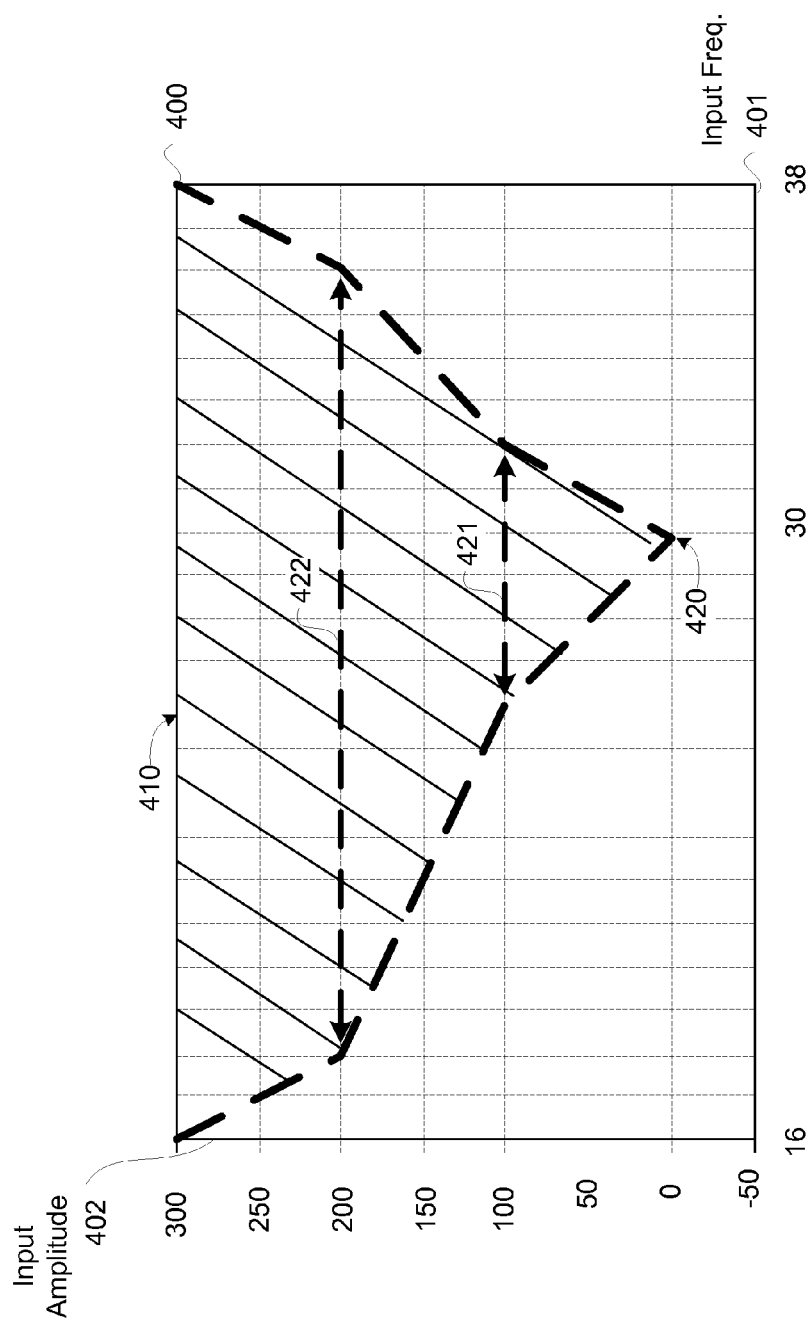
FIG. 4 is a plot diagram depicting an exemplary sensitivity curve for an IQ divider, such as the IQ divider of FIG. 3 for example.

FIG. 4 is a plot diagram depicting an exemplary input frequency 401 versus input amplitude 402 for a sensitivity curve 400 for an IQ divider, such as IQ divider 300 of FIG. 3 for example. For purposes of clarity by way of example and not limitation, values for a range of in excess of 10 GHz, namely from approximately 16 to 38 GHz, for input frequency 401 and values for a range of approximately −50 mV to 300 mV for input amplitude 402 are provided; however, it should be understood that these and/or other values may be used as described herein.

Sensitivity curve 400 may be for a nominal corner of semiconductor process, voltage, and/or temperature ("PVT") variations. Along those lines, hashed region 410 above and including sensitivity curve 400 is a region of proper operation of IQ divider 300.

For no or zero input amplitude, IQ divider 300 has a self-resonance frequency 420 significantly above 10 GHz. Generally, a self-resonance frequency of IQ divider 300 may be at least close to an operating frequency for a VCO 106 or other oscillator having its output divided by an IQ divider.

For an input amplitude of approximately 100 mV, IQ divider 300 may have a frequency range of operation, as generally indicated by double arrow ended line 421. Stated another way, for a nominal PVT corner, for IQ divider 300 to have at least a frequency range of operation 421, namely for IQ divider 300 to properly divide an input frequency of clocks 310 and 320 in such a frequency range, clocks 310 and 320 may each have at least approximately a 100 mV amplitude swing. For example, if an input frequency to IQ divider 300 on for example clock 310 is at a self-resonance frequency 420, for IQ divider to divide such frequency into two clock signals with each at half of such self-resonance frequency 420, then a minimum of at least approximately a 100 mV amplitude swing on clock 310 is present, and likewise for clock 320. If such swing is less than such minimum amplitude, IQ divider 300 frequency output may be somewhere in between such self-resonance frequency 420 and an input frequency.

For an input amplitude of approximately 200 mV, IQ divider 300 may have a different frequency range of operation, as generally indicated by double arrow ended line 422. Stated another way, for a nominal PVT corner, for IQ divider 300 to have at least a frequency range of operation 422, where clocks 310 and 320 may each have at least approximately a 200 mV amplitude swing.

Generally, for frequencies further away from a self-resonance frequency of IQ divider 300, a larger input amplitude is used to be in a region of proper operation 410. Accordingly, for an integrated circuit device having an IQ divider 300, a manufacturer of such integrated circuit device may want to make a representation for a minimum input amplitude of such IQ divider 300 for a predetermined frequency range of operation. However, not all IQ dividers 300 in a same or multiple integrated circuit die may have a same sensitivity curve 400, including without limitation not all IQ dividers thereof may have a same self-resonance frequency.

Figures 5, 6:
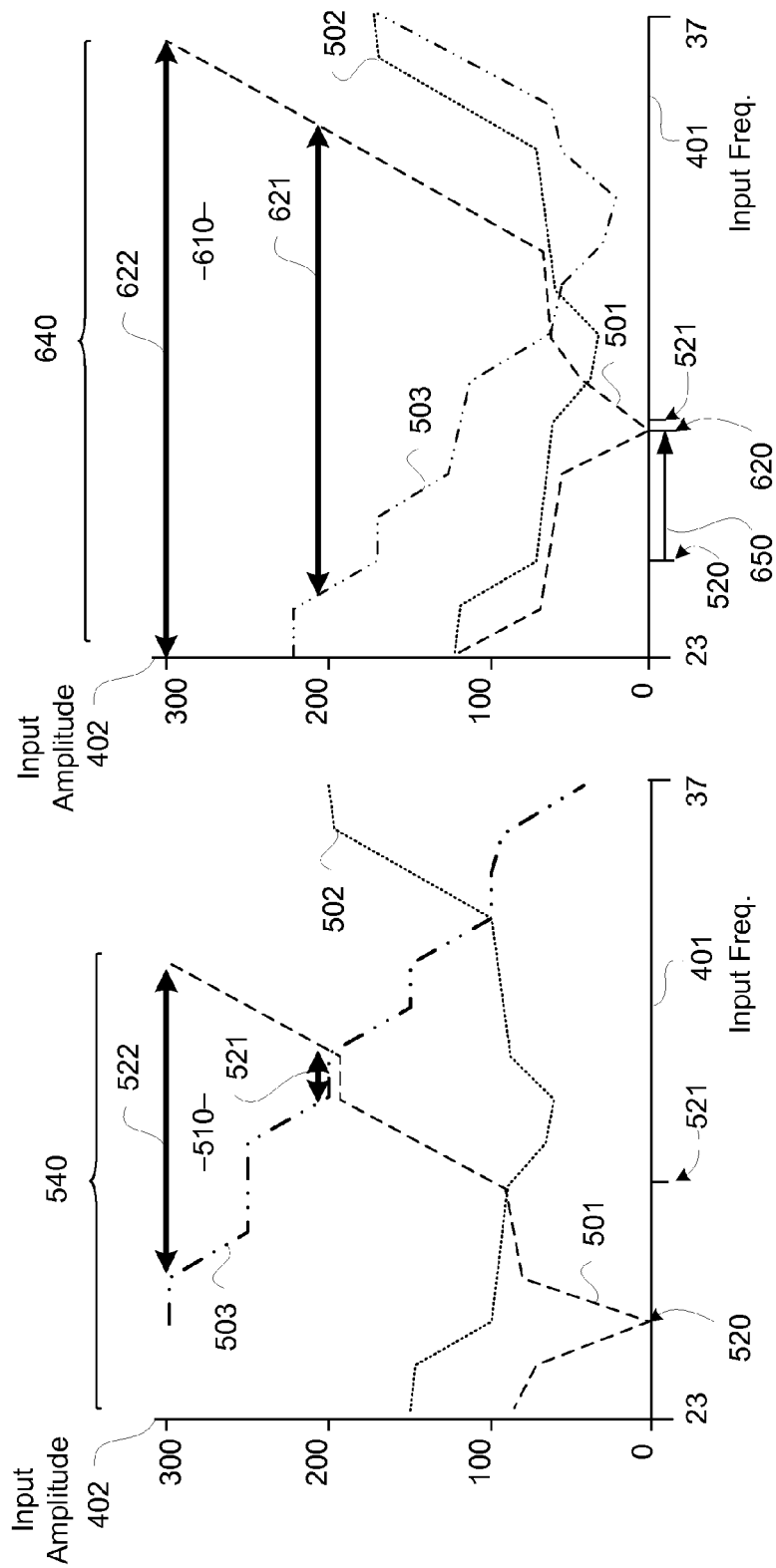
FIG. 5 is a plot diagram depicting exemplary sensitivity curves for IQ dividers, such as the IQ divider of FIG. 3 for example, before tuning such IQ divider.
FIG. 6 is a plot diagram depicting another exemplary sensitivity curves for an IQ divider, such as the IQ divider of FIG. 3 for example, after tuning such IQ divider.

FIG. 5 is a plot diagram depicting an exemplary input frequency 401 versus input amplitude 402 for a sensitivity curve 501 for an IQ divider, such as IQ divider 300 of FIG. 3 for example, before tuning such IQ divider. Sensitivity curve 501 is for a "slow" PVT corner. For purposes of clarity by way of example and not limitation, values for a range of in excess of 10 GHz, namely from approximately 23 to 37 GHz, for input frequency 401 and values for a range of approximately 0 mV to 300 mV for input amplitude 402 are provided; however, it should be understood that these and/or other values may be used as described herein.

In other words, IQ divider 300 may have a slow PVT corner, and generally other IQ dividers 300 on such a microelectronic die component may have a slow PVT corner. Along those lines for purposes of comparison, sensitivity curve 502 is for a "nominal" or "medium" PVT corner, and sensitivity curve 503 is for a "fast" PVT corner. Of course, these sensitivity curves 501 through 503 are merely examples for purposes of clarity, and any of a variety of sensitivity curves may be used as may vary from application to application.

For an IQ divider 300 with a slow PVT corner sensitivity curve 501, a self-resonance frequency 520 thereof may be far away from a predetermined frequency of operation 521. Along those lines, a region of operation 540 may be defined as being above sensitivity curve 501. However, a guaranteed region of operation 510 may be defined as being above a slow PVT corner current sensitivity curve 501 for IQ divider 300, prior to tuning thereof, and also above a fast PVT corner sensitivity curve 503. Effectively, these areas above curves 501 and 503 define a region between them, namely region 510. Region 510 is within or a subset of a region above sensitivity curve 502. This guaranteed region of operation 510 generally refers to a range of operable amplitudes and a corresponding range of operable frequencies associated with multiple PVT corners.

In this example, for an input amplitude of approximately 200 mV, IQ divider 300 may have a frequency range of operation, as generally indicated by double arrow ended line 521, between sensitivity curves 501 and 503. For an input amplitude of approximately 300 mV, IQ divider 300 may have a different frequency range of operation, as generally indicated by double arrow ended line 522, between sensitivity curves 501 and 503.

FIG. 6 is a plot diagram depicting an exemplary input frequency 401 versus input amplitude 402 for a sensitivity curve 501 for an IQ divider, such as IQ divider 300 of FIG. 3 for example, after tuning such IQ divider. Again, for purposes of clarity by way of example and not limitation, values for a range of in excess of 10 GHz, namely from approximately 23 to 37 GHz, for input frequency 401 and values for a range of approximately 0 mV to 300 mV for input amplitude 402 are provided; however, it should be understood that these and/or other values may be used as described herein. Sensitivity curve 501 for a "slow" PVT corner is shifted so a self-resonance frequency 620 of IQ divider 300 after tuning is closer to or at a predetermined frequency of operation 521. Effectively, self-resonance frequency 520 of IQ divider 300 before tuning is shifted to become self-resonance frequency 620 of IQ divider 300 after tuning, as generally indicated with arrow 650. Sensitivity curves 502 and 503 of course are for other dies for purposes of comparison and so are unchanged.

Along those lines, a region of proper operation 640 may be an entire region above a shifted-sensitivity curve 501 for IQ dividers 300 of a microelectronic die component having such a slow PVT corner. Additionally, a combined or guaranteed region of operation 610 may be defined as being between and above an updated sensitivity curve 501 for IQ divider 300 with tuning thereof and a fast PVT corner sensitivity curve 503. Region 610 is within or a subset of a region above sensitivity curve 502, and generally may be considered a guaranteed region of operation regardless of PVT conditions.

In this example, for an input amplitude of approximately 200 mV, IQ divider 300 with an updated sensitivity curve 501 may have a frequency range of operation, as generally indicated by double arrow ended line 621, and for an input amplitude of approximately 300 mV, IQ divider 300 with an updated sensitivity curve 501 may have a frequency range of operation, as generally indicated by double arrow ended line 622. Optionally, a variety of sensitivity curves of different microelectronic dies may be shifted at least toward a frequency of operation by adjusting a self-resonance frequency. However, generally a sensitivity curver may be moved such that an operation range above such sensitivity curver is more centered around a predetermined frequency of operation after such movement than prior thereto.

Optionally or additionally, Ibias current 341 of IQ divider 300 may be adjusted. An adjustable Ibias current 341 may be used to decrease load impedance, such as load resistance component thereof for example, to move a self-resonance frequency of IQ divider 300 to a higher frequency. In other words, output of IQ divider 300 may be smaller because it is proportional to I*R. Therefore, Ibias current 341 may be increased to keep an output swing constant. Optionally or additionally, changing Ibias current 341 may possibly change device parasitic capacitance and slightly change self-resonance frequency of IQ divider 300. Furthermore, controlling these parameters may be used to shift a sensitivity curve 501 up and/or to the right for higher frequencies.

With the above-description borne in mind, reference to FIG. 2 is renewed. A reference clock signal 110 is provided as a clock input to counter 201. A feedback clock signal 135, which may be sourced from feedback divider 124, is provided as a clock input to counter 202. In other configurations, there may be no feedback divider 124. Clock signals 110 and 124 are likewise provided as inputs to PFD 101.

Controller 210 may include a finite state machine ("FSM") 203 coupled to receive a reference frequency count signal ("reference frequency count") 211 and a feedback frequency count signal ("feedback frequency count") 212 to determine a difference, if any difference is discernable between them, to provide a control setting 213.

Figure 7:
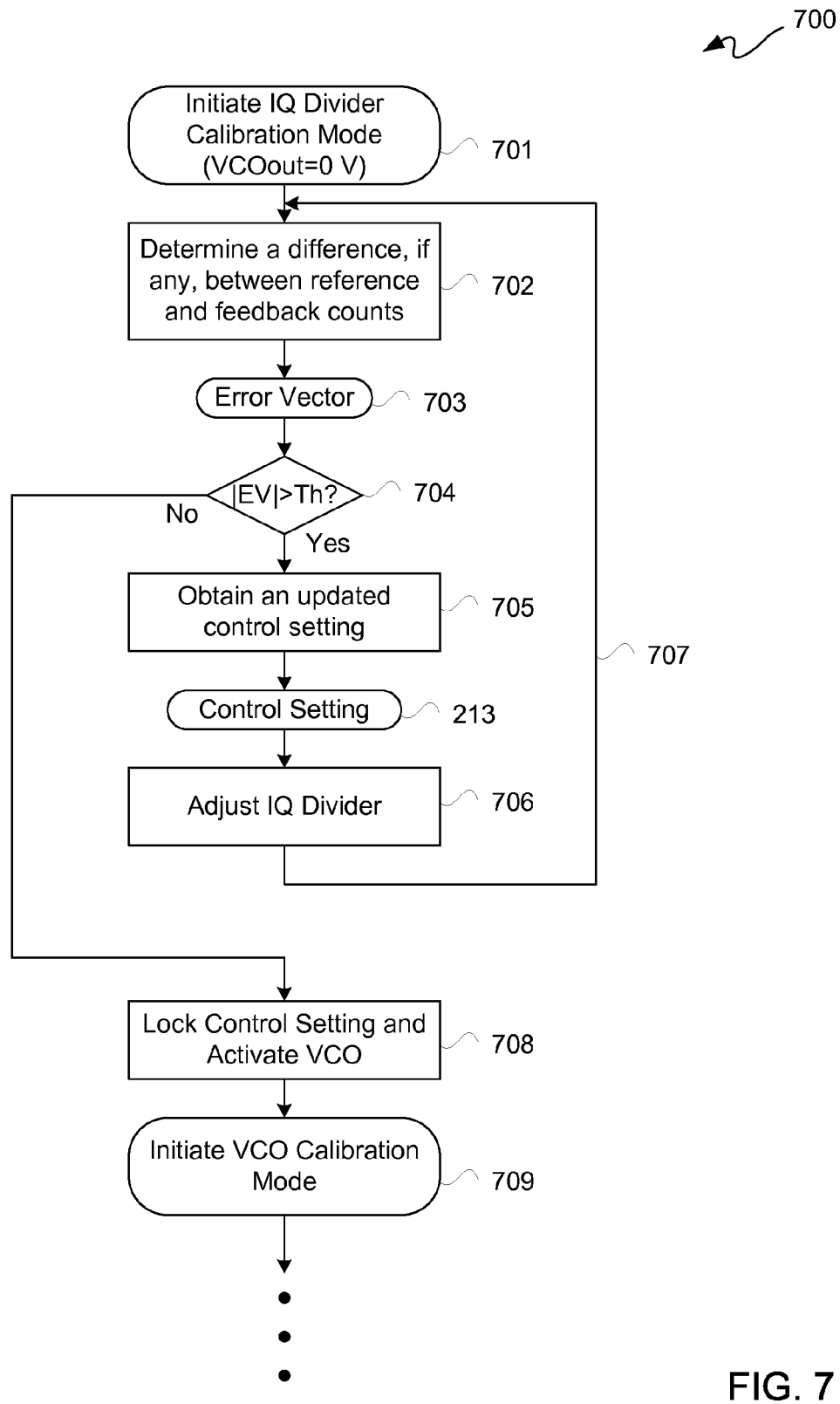
FIG. 7 is a flow diagram depicting an exemplary PLL tuning flow.

Along those lines, FIG. 7 is a flow diagram depicting an exemplary PLL tuning flow 700, such as for QPLL 200 of FIG. 2 for example. With simultaneous reference to FIGS. 2 and 7, each of those figures is further described.

At 701, an IQ divider calibration mode is initiated. For purposes of clarity by way of example and not limitation, it shall be assumed that this calibration mode is for adjusting a load impedance of IQ divider 120. However, such a calibration mode may be to adjust a load impedance, a load capacitance, and/or a tail current bias of IQ divider 120 in other examples.

For such initiation, output of VCO 106 is set to be 0 volts or another DC value or powered down. Effectively, this disabling any output from VCO 106 opens a loop of QPLL 200, and this initiation or disabling of VCO 106 may cause IQ divider 120 to self-resonate.

Accordingly, a feedback clock signal 135 may be generated. As a reference clock signal 110 is provided, counts 211 and 212 respectively associated with clock signals 110 and 135 may be obtained at 701.

FSM 203 may include check circuitry 204 coupled and configured to determine a difference between counts 211 and 212. At 702, such a difference, if any, between counts 211 and 212 may be determined to provide an error vector 703. If such error vector 703, or more particularly an error vector magnitude, is outside of an acceptable threshold as determined at 704, then check circuitry 204 may pass such error vector 703 to a look-up table ("LUT") 205 to obtain another control setting 213, namely an updated or revised control setting 213, at 705. IQ divider 120 may have a default resistance setting in a register 250 of FSM 203 for initial operation, and so such default setting up may be updated by a control signal or code 213 obtained from LUT 205.

In this example, control setting 213 is provided on a separate bus to IQ divider 120, than a control setting 214 for setting a capacitance of VCO 106. However in another configuration, a single shared bus may be used, where after a final control setting is loaded into register 250, register 250 is disabled for any subsequent changes thereto, and so a control setting 214 will not disturb contents of such register.

At 706, IQ divider 120 may be adjusted or updated with such control setting 213 obtained at 705, namely such control setting 213 may be sent as an update or revision to a prior control setting 213. Again, control setting 213 for this example is to adjust an adjustable resistance of IQ divider 120 to effectively adjust an RC time constant or delay thereof. However, in another example, this resistance and/or other adjustable components of IQ divider 120, as described herein, may be adjusted for reasons as described elsewhere herein. Moreover, at 706, a tail current of IQ divider 120 may be adjusted responsive to bits of control setting 213 to provide generally for a constant output swing.

After adjustment, such feedback loop 707 is used to obtain a new feedback count to determine a difference with a reference count at 702. In other words, with IQ divider 120 adjusted, feedback clock signal 135 may likewise be adjusted. Feedback loop 707 may be repeated until the frequency of clock signal 135 is equal to or equal to a predetermined multiple or fraction, or within a threshold therefor, of the frequency of reference clock signal 110. When this condition occurs, error vector 703 may not be greater than a threshold therefor as determined at 704.

In response to error vector 703 not being greater than such threshold as determined at 704, at 708 a then present control setting 213, such as in register 250, may be locked. Even though the example of a register is used, other means, such as fuses, memory cells, and the like, may be used to store a control value. Furthermore, at 708, VCO 106 may be activated, namely output of VCO 106 may be allowed to oscillate for a next calibration mode.

Along those lines, at 709, a calibration mode for setting capacitance of VCO 106 may be initiated. An external control voltage 111 may be input to mux 103 and selected for output therefrom responsive to assertion of control select signal 113. Use of an external control voltage 111, which effectively opens a loop of QPLL 200, may be used for calibration of VCO 106. External control voltage 111 may be between a ground and a supply voltage level, such as Vdd/2 or Vcc/2 for example. As this calibration mode is known, it is not described herein in unnecessary detail.

FSM 203 may be configured to switch from a calibration mode for calibration of a load impedance of IQ divider 120 to a calibration mode for calibration of a capacitance of VCO 106. In this VCO calibration mode, FSM 203 may reuse check circuitry 204, as well as counters 201 and 202, to determine an error vector to look-up a capacitance setting for a control setting 214 to provide to VCO 106.

LUT 205 of FSM 203 may store a plurality of control settings, such as a plurality of resistance settings for setting a load impedance of IQ divider 120. Tuning of IQ divider 120 may be done in a semiconductor fab, though it may be done in real time to adjust to environmental changes. With respect to controller 210, controller 210 may be built-in self-test ("BIST") circuitry, or may be configured with programmable resources of an integrated circuit device, such as an FPGA 1000 of FIG. 10 for example, or a combination thereof. If BIST circuitry, controller 210 may optionally be coupled to receive a temperature control signal 251 and/or a voltage control signal 252, or other control signal, to reinitiate PLL tuning flow 700.

However, generally, QPLL 200 may be adjusted by a semiconductor manufacturer prior to shipment. As described herein, this tuning may be used to shift a self-resonance frequency closer to a frequency of operation, to a middle or elsewhere in a range of frequencies of operation, in order to provide a broader range of operation of IQ divider 120 and/or a lower input amplitude. Lower input amplitude at a frequency of operation means less power may be consumed in addition to a more robust operational state by expansion of a range of frequencies for proper operation.

Figure 8:
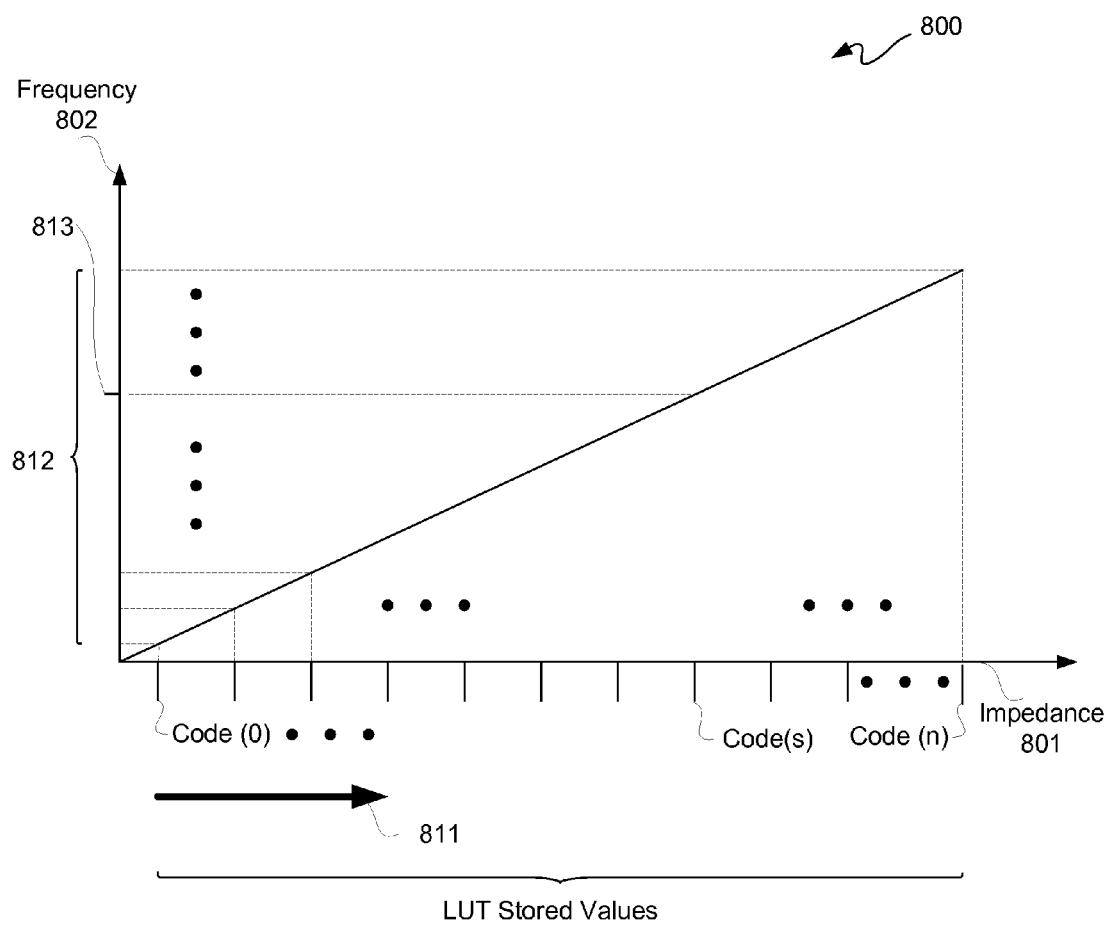
FIG. 8 is a plot diagram depicting an exemplary code versus frequency plot.

To populate LUT 205 with codes for control settings 213, code values may be swept to obtain corresponding frequencies. For example, FIG. 8 is a plot diagram depicting an exemplary code versus frequency plot 800. Along horizontal axis 801 are impedance settings or codes for an IQ divider 120, namely code(0) through code (n) for n a positive integer greater than zero, where each of such codes may be multiple bits long. Codes(0) through (n) may, though need not, represent all possible adjustments to an IQ divider 120.

Codes(0) through code(n) may be swept, as generally indicated by arrow 811 for self-resonance frequencies of an IQ divider 120, for a set reference frequency 110 input. Thus, a corresponding set of self-resonance frequencies 812 output from such an IQ divider 120 may be obtained as indicated along vertical axis 802. These self-resonance frequencies 812 output from IQ divider 120 for such corresponding impedance settings given by codes(0) through (n) may be used to identify which code of codes(0) to code(n) to select to have a self-resonance frequency equal to an output operating frequency of a PLL. A self-resonance frequency may be directly or inversely proportional to an impedance control code of codes(0) to code(n).

Along those lines, for a predetermined or a priori known frequency of operation 813 of a PLL for a set input reference frequency 110, a corresponding code(s) may be selected. Thus, codes(0) through code(n) may be values stored in LUT 205, an these codes may be selectable controlling settings 213. Frequencies 812 may be indexed, such as respectively assigned numbers from 0 to n for example, corresponding to codes(0) to code(n). These assigned numbers may in effect take the place of error vectors and thus may be used as pointers to LUT 205. Thus, a code(s) may be selected for a corresponding frequency of operation 813 for output of such code(s) as a control setting 213 without iteratively checking, as previously described.

This may be performed in a semiconductor fab to set IQ dividers 120 on a chip. Therefore, rather than tuning each IQ divider 120 individually as previously described, a "golden" or reference IQ divider 120 may be characterized for a single die by sweeping codes therefor, and a remainder of IQ dividers 120 on such chip may subsequently use this characterization to select a code or codes therefor.

Figure 9:
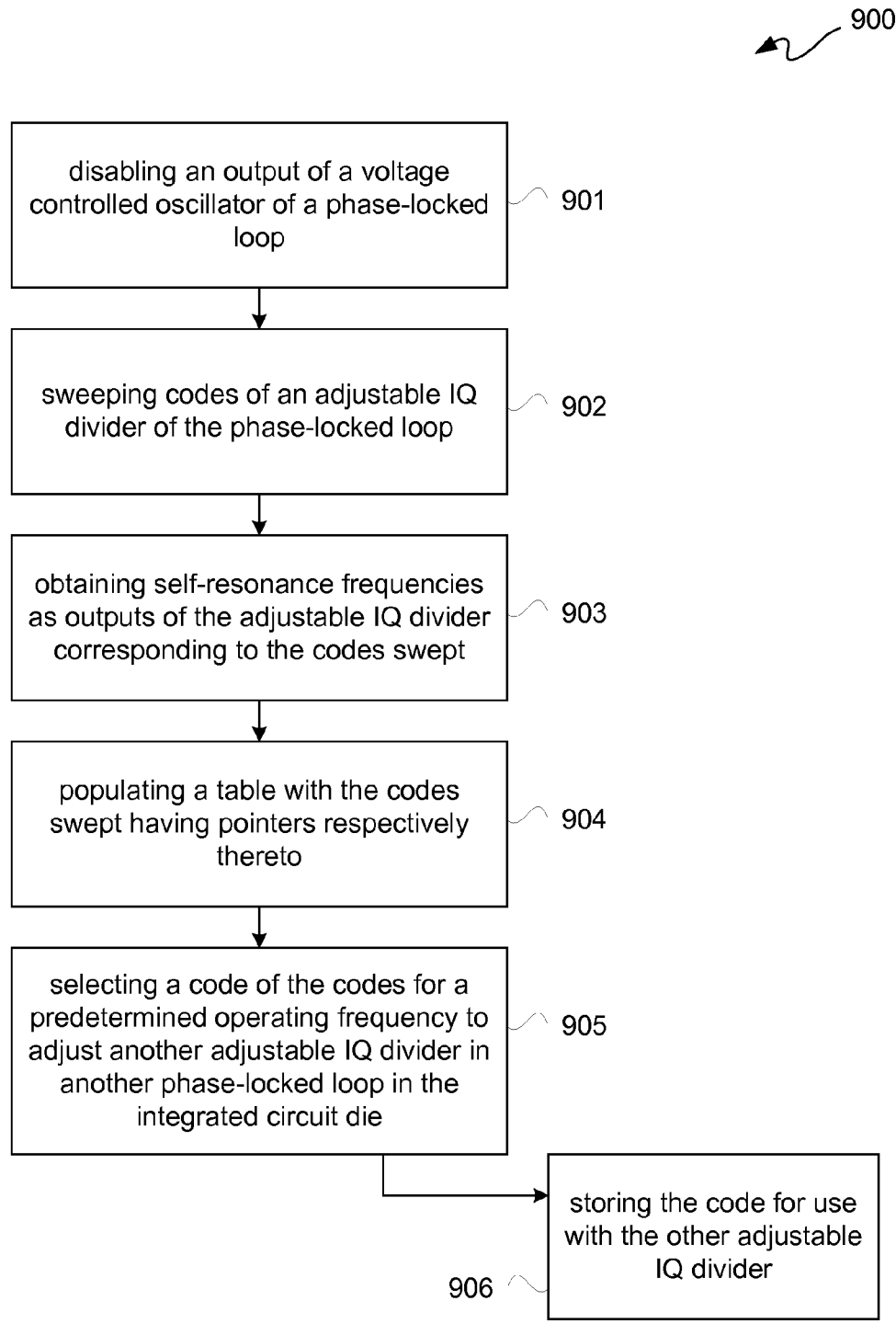
FIG. 9 is a flow diagram depicting an exemplary operating range adjustment flow.

FIG. 9 is a flow diagram depicting an exemplary operating range adjustment flow 900. An FPGA, such as FPGA 1000 of FIG. 10, or other integrated circuit die may have multiple phase-locked loops, such as QPLL 200 of FIG. 2. However, rather than sampling reference and feedback clock frequency counts for each PLL to adjust each IQ divider thereof, one of such IQ dividers on such integrated circuit die may be characterized, and a remainder of such IQ dividers on such integrated circuit die may be based on such characterization. This of course assumes that a PVT corner for an integrated circuit die is generally the same for other PLLs on such die. FIG. 9 is further described with simultaneous reference to FIG. 2.

Along the above liens, at 901 an output of a VCO of a PLL, such as VCO 106 of QPLL 200, is disabled. At 902, codes, such as codes(0) through code(n), of an adjustable IQ divider, such as IQ divider 120, of such PLL coupled on an output side of such VCO may be swept, such that each code thereof is successively processed, such as loaded into register 250 for example. At 903, self-resonance frequencies may be obtained as outputs of such an adjustable IQ divider corresponding to the codes swept at 902. At 904, a table, such as LUT 204, may be populated with codes swept at 902 with respective pointers into such table. These pointers may be respectively associated with such self-resonance frequencies obtained at 903. At 905, a code of such tabularized codes may be selected for a predetermined operating frequency to adjust another adjustable IQ divider 120 in another PLL 200 in such integrated circuit die. This selecting of a code at 905 may include at 906 storing such selected code, such as in another register 250, for use with such other adjustable IQ divider 120.

Returning to FIG. 2, though a single VCO 106 may be used, in this example VCO 106 includes a first VCO 107 and a second VCO 108 bussed to receive a control setting 214. Each of VCOs 107 and 108 may be coupled to receive a filtered output 115 from PLL ("loop") filter 104 to respectively provide a first oscillation signal 116 and a second oscillation signal 117. Such first VCO 107 may be configured for an upper-band ("UB") of a frequency range of a plurality of frequencies, and such second VCO 107 may be configured for a lower-band ("LB") of such frequency range. However, only one of such first and second VCOs 107 may be tuned at a time, namely one is turned ON while the other is disabled, for the above-described operation.

Mux 109 may receive first oscillation signal 116 and second oscillation signal 117 as inputs and be coupled to receive a control select signal 118 to select either first oscillation signal 116 or second oscillation signal 117 as an oscillator output 131 from mux 109. IQ divider 120 may be coupled to receive oscillator output 131, which may be either of clock signals 310 or 320 for example.

In this example, IQ divider 120 may provide at least two outputs 236. In this example for a QPLL 200, IQ divider 120 is a divide-by-2 IQ divider and provides a first quadrature clock signal 132 and a second quadrature clock signal 133 output. A first level shifter 121 may be coupled to receive first quadrature clock signal 132 output from IQ divider 120, and a second level shifter 122 may be coupled to receive second quadrature clock signal 133 output from IQ divider 120.

A feedback divider 124 may be coupled to receive a first level-shifted output 134 from first level shifter 121 to output feedback clock signal 135. In this example, level shifters 121 and 122 are each a CML-to-CMOS voltage level shifter; however, in other configurations other voltage levels may be used. A termination node 123 may receive a second level-shifted output from second level shifter 122 to provide a dummy load for balancing outputs from IQ divider 120.

A PFD 101 may receive feedback clock signal 135 and reference clock signal 110 to provide a voltage output as an internal or in-loop control voltage 112. PFD 101 may include a charge pump ("CP") 102 to provide such internal control voltage in response to a phase and/or frequency difference between clock signals 110 and 135.

Mux 103 may be coupled to receive internal control voltage 112 and external control voltage 111 as inputs and coupled to receive control select signal 113 to select either as a control voltage 114 for input to loop filter 104. Loop filter 103 may be coupled to receive control voltage 114 to provide a filtered output 115 to VCO 106.

In this example, VCO 106 may be an inductance-capacitance ("LC") tank oscillator. Along those lines, QPLL 200 may be an LC-QPLL.

Because one or more of the examples described herein may be implemented in an FPGA, a detailed description of such an IC is provided. However, other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are partially programmable. For example, one type of PLD includes a combination of hard-coded transistor logic and a programmable switch fabric that programmably interconnects the hard-coded transistor logic.

Figure 10:
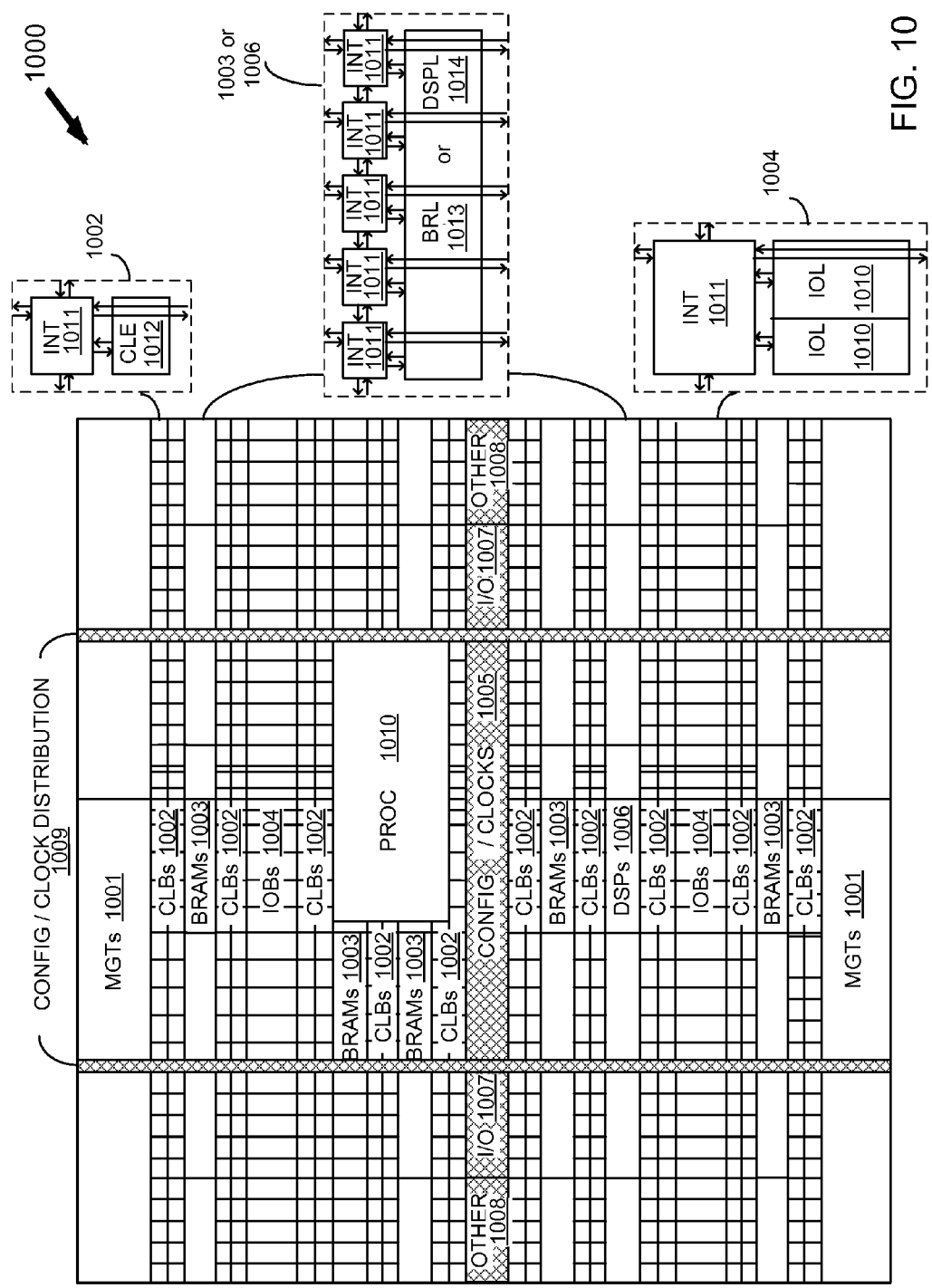
FIG. 10 is a simplified block diagram depicting an exemplary columnar Field Programmable Gate Array ("FPGA") architecture.

As noted above, advanced FPGAs can include several different types of programmable logic blocks in the array. For example, FIG. 10 illustrates an FPGA architecture 1000 that includes a large number of different programmable tiles including multi-gigabit transceivers ("MGTs") 1001, configurable logic blocks ("CLBs") 1002, random access memory blocks ("BRAMs") 1003, input/output blocks ("IOBs") 1004, configuration and clocking logic ("CONFIG/CLOCKS") 1005, digital signal processing blocks ("DSPs") 1006, specialized input/output blocks ("I/O") 1007 (e.g., configuration ports and clock ports), and other programmable logic 1008 such as digital clock managers, analog-to-digital converters, system monitoring logic, and so forth. Some FPGAs also include dedicated processor blocks ("PROC") 1010.

In some FPGAs, each programmable tile includes a programmable interconnect element ("INT") 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 can include a configurable logic element ("CLE") 1012 that can be programmed to implement user logic plus a single programmable interconnect element ("INT") 1011. A BRAM 1003 can include a BRAM logic element ("BRL") 1013 in addition to one or more programmable interconnect elements. Typically, the number of interconnect elements included in a tile depends on the height of the tile. In the pictured configuration, a BRAM tile has the same height as five CLBs, but other numbers (e.g., four) can also be used. A DSP tile 1006 can include a DSP logic element ("DSPL") 1014 in addition to an appropriate number of programmable interconnect elements. An IOB 1004 can include, for example, two instances of an input/output logic element ("IOL") 1015 in addition to one instance of the programmable interconnect element 1011. As will be clear to those of skill in the art, the actual I/O pads connected, for example, to the I/O logic element 1015 typically are not confined to the area of the input/output logic element 1015.

In the pictured configuration, a horizontal area near the center of the die (shown in FIG. 10) is used for configuration, clock, and other control logic. Vertical columns 1009 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, processor block 1010 spans several columns of CLBs and BRAMs.

Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

To recapitulate, an apparatus relates generally to providing a divided signal output. In such an apparatus, a controller is coupled to receive a reference frequency count and a feedback frequency count to determine a difference therebetween to provide a control setting. A divider is coupled to receive the control setting to provide the divided signal output. The divider includes an adjustable load impedance. The control setting is coupled to adjust the load impedance of the divider to adjust a self-resonance frequency of the divider.

In the immediately preceding paragraph, the controller can include: a first counter coupled to receive a reference clock signal to provide the reference frequency count; and a second counter coupled to receive a feedback clock signal to provide the feedback frequency count. The controller can include a finite state machine coupled to receive the reference frequency count and the feedback frequency count to determine the difference in order to provide the control setting. The finite state machine can be configured to switch between a first calibration mode for calibration of the divider and a second calibration mode for calibration of a voltage controlled oscillator. The finite state machine can include a table to store a plurality of resistance settings including a resistance setting for the load impedance of the divider. The control setting can further be coupled to adjust a tail current of the divider. The divider can be an IQ divider. The apparatus can further include: a voltage controlled oscillator; a multiplexer coupled to the voltage controlled oscillator to select an oscillator output for input to the IQ divider; a first level shifter coupled to receive a first quadrature clock signal output from the IQ divider; and a second level shifter coupled to receive a second quadrature clock signal output from the IQ divider. The IQ divider can be a divide-by-2 IQ divider. The apparatus can further include: a feedback divider coupled to receive a first level-shifted output from the first level shifter to output the feedback clock signal; a termination node coupled to receive a second level-shifted output from the second level shifter to provide a dummy load for the IQ divider; a phase-frequency detector coupled to receive the feedback clock signal and the reference clock signal to provide an internal voltage; and a loop filter coupled to receive a control voltage to provide a filtered output. The voltage controlled oscillator can be coupled to receive the filtered output. The voltage controlled oscillator can include: an inductance-capacitance ("LC") tank oscillator to provide an LC-quadrature phase-locked loop ("LC-QPLL"). The voltage controlled oscillator can include a first voltage controlled oscillator and a second voltage controlled oscillator coupled to receive the filtered output to respectively provide a first oscillation signal and a second oscillation signal. The first voltage controlled oscillator can be configured for an upper frequency range of a plurality of frequencies. The second voltage controlled oscillator can be configured for a lower frequency range of the plurality of frequencies. The multiplexer can be coupled to receive the first oscillation signal and the second oscillation signal as inputs and coupled to receive a first control select signal to select either the first oscillation signal or the second oscillation signal as the oscillator output. Another multiplexer can be coupled to receive the internal voltage and an external voltage as inputs and coupled to receive a second control select signal to select either as the control voltage for input to the loop filter.

To further recapitulate, a method relates generally to tuning an adjustable divider. In such a method, a calibration mode is initiated to cause the adjustable divider to self-resonate to obtain a feedback count. A difference is determined between a reference count and the feedback count to produce an error vector. A control setting is obtained using the error vector. The adjustable divider is adjusted with the control setting.

In the immediately preceding paragraph, the adjusting of the adjustable divider can shift a sensitivity curve thereof. The adjusting of the adjustable divider can shift a self-resonance frequency of the adjustable divider at least closer to a predetermined frequency of operation. It can be determined whether a magnitude of the error vector is greater than a threshold value, the operations of obtaining and adjusting can be repeated to obtain an updated feedback count; and the operation of determining can be repeated with the updated feedback count to produce an updated error vector. The adjusting can include an adjustment of a resistance of the adjustable divider. The adjusting can include an adjustment of a capacitance of the adjustable divider. The adjusting can include an adjustment of a tail current bias voltage of the adjustable divider. The adjusting can include an adjustment of a resistance and a tail current bias voltage of the adjustable divider To yet further recapitulate, a method relates generally to adjusting an operating range of a phase-locked loop in an integrated circuit die. In such a method, an output of a voltage controlled oscillator of the phase-locked loop is disabled. Codes of an adjustable IQ divider of the phase-locked loop are swept. Self-resonance frequencies are obtained as outputs of the adjustable IQ divider corresponding to the codes swept. A table is populated with the codes swept having pointers respectively thereto. The pointers are respectively associated with the self-resonance frequencies. A code of the codes is selected for a predetermined operating frequency to adjust another adjustable IQ divider in another phase-locked loop in the integrated circuit die. In such selecting of the code, storing the code for use with the other adjustable IQ divider can be included.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for providing a divided signal output, comprising:
    a controller configured to receive a reference frequency count and a feedback frequency count and configured to determine a difference between the reference frequency count and the feedback frequency count to provide as a control setting;
    an output divider ("divider") configured to receive the control setting and to divide the control setting to provide the divided signal output;
    wherein the divider includes an adjustable load impedance; and
    wherein the divider is configured to adjust load impedance of the divider responsive to the control setting to adjust a self-resonance frequency of the divider.

2. The apparatus according to claim 1, wherein the controller comprises:
    a first counter configured to receive a reference clock signal to provide the reference frequency count; and
    a second counter configured to receive a feedback clock signal to provide the feedback frequency count.

3. The apparatus according to claim 2, wherein the controller includes a finite state machine configured to receive the reference frequency count and the feedback frequency count to determine the difference in order to provide the control setting.

4. The apparatus according to claim 3, wherein the finite state machine is configured to switch between a first calibration mode for calibration of the divider and a second calibration mode for calibration of a voltage controlled oscillator.

5. The apparatus according to claim 3, wherein the finite state machine includes a table to store a plurality of resistance settings including a resistance setting for the load impedance of the divider.

6. The apparatus according to claim 3, wherein the control setting is further configured to adjust a tail current of the divider.

7. The apparatus according to claim 3, wherein the divider is an IQ divider, the apparatus further comprising:
    a voltage controlled oscillator;
    a multiplexer coupled to the voltage controlled oscillator and configured to select an oscillator output for input to the IQ divider;
    wherein the IQ divider is a divide-by-2 IQ divider;
    a first level shifter configured to receive a first quadrature clock signal output from the IQ divider; and
    a second level shifter configured to receive a second quadrature clock signal output from the IQ divider.

8. The apparatus according to claim 7, further comprising:
    a feedback divider configured to receive a first level-shifted output from the first level shifter to output the feedback clock signal;
    a termination node configured to receive a second level-shifted output from the second level shifter to provide a dummy load for the IQ divider;
    a phase-frequency detector configured to receive the feedback clock signal and the reference clock signal to provide an internal voltage;
    a loop filter configured to receive a control voltage to provide a filtered output; and
    wherein the voltage controlled oscillator is configured to receive the filtered output.

9. The apparatus according to claim 8, wherein:
    the voltage controlled oscillator comprises an inductance-capacitance ("LC") tank oscillator; and
    the apparatus is an LC-quadrature phase-locked loop ("LC-QPLL").

10. The apparatus according to claim 8, wherein the voltage controlled oscillator comprises:
    a first voltage controlled oscillator and a second voltage controlled oscillator configured to receive the filtered output to respectively provide a first oscillation signal and a second oscillation signal;
    wherein the first voltage controlled oscillator is for an upper frequency range of a plurality of frequencies;
    wherein the second voltage controlled oscillator is for a lower frequency range of the plurality of frequencies;
    wherein the multiplexer is a first multiplexer;
    wherein the first multiplexer is configured to receive the first oscillation signal and the second oscillation signal as inputs and configured to receive a first control select signal to select either the first oscillation signal or the second oscillation signal as the oscillator output; and
    a second multiplexer configured to receive the internal voltage and an external voltage as inputs and configured to receive a second control select signal and configured to select either the internal voltage or the external voltage as the control voltage for input to the loop filter.

11. A method for tuning an adjustable divider, comprising:
    initiating a calibration mode to cause the adjustable divider to self-resonate to obtain a feedback count;
    determining a difference between a reference count and the feedback count to produce an error vector;
    obtaining a control setting using the error vector; and
    adjusting impedance of the adjustable divider with the control setting.

12. The method according to claim 11, wherein the adjusting of the adjustable divider shifts a sensitivity curve thereof.

13. The method according to claim 11, wherein the adjusting of the adjustable divider shifts a self-resonance frequency of the adjustable divider at least closer to a predetermined frequency of operation.

14. The method according to claim 11, further comprising:
    determining whether a magnitude of the error vector is greater than a threshold value;
    repeating the steps of obtaining and adjusting to obtain an updated feedback count; and
    repeating the step of determining with the updated feedback count to produce an updated error vector.

15. The method according to claim 11, wherein the adjusting comprises an adjusting of an adjustable resistance of the adjustable divider.

16. The method according to claim 11, wherein the adjusting comprises an adjusting of an adjustable capacitance of the adjustable divider.

17. The method according to claim 11, wherein the adjusting comprises an adjusting of an adjustable tail current bias voltage of the adjustable divider.

18. The method according to claim 11, wherein the adjusting comprises an adjusting of an adjustable resistance and an adjustable tail current bias voltage of the adjustable divider.

19. A method for adjusting an operating range in an integrated circuit die, comprising:
- disabling an output of a voltage controlled oscillator of a first phase-locked loop;
- sweeping codes of a first adjustable IQ divider of the first phase-locked loop;
- obtaining self-resonance frequencies as outputs of the first adjustable IQ divider corresponding to the codes swept;
- populating a table with the codes swept having pointers respectively thereto;
- wherein the pointers are respectively associated with the self-resonance frequencies; and
- selecting a code of the codes swept for a predetermined operating frequency to adjust a second adjustable IQ divider in a second phase-locked loop in the integrated circuit die.

20. The method according to claim 19, wherein the selecting of the code comprises storing the code for use with the second adjustable IQ divider.

\* \* \* \* \*